United States Patent
Lee et al.

(10) Patent No.: US 10,932,362 B2
(45) Date of Patent: Feb. 23, 2021

(54) CIRCUIT BOARD

(71) Applicant: LG INNOTEK CO., LTD., Seoul (KR)

(72) Inventors: Jong Sik Lee, Seoul (KR); Jin A Gu, Seoul (KR); Soo Jung Yoon, Seoul (KR); Gyung Seok Lee, Seoul (KR); Hyun Gu Im, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/649,913

(22) PCT Filed: Sep. 18, 2018

(86) PCT No.: PCT/KR2018/010985
§ 371 (c)(1),
(2) Date: Mar. 23, 2020

(87) PCT Pub. No.: WO2019/059612
PCT Pub. Date: Mar. 28, 2019

(65) Prior Publication Data
US 2020/0315004 A1    Oct. 1, 2020

(30) Foreign Application Priority Data
Sep. 21, 2017 (KR) .......................... 10-2017-0121885

(51) Int. Cl.
*H05K 1/03* (2006.01)
*H05K 1/09* (2006.01)
(Continued)

(52) U.S. Cl.
CPC .............. *H05K 1/036* (2013.01); *C08K 3/38* (2013.01); *C08K 9/06* (2013.01); *C09C 1/00* (2013.01);
(Continued)

(58) Field of Classification Search
CPC ....... H05K 1/036–0373; H05K 1/0353; H05K 1/0204; C08K 3/38
See application file for complete search history.

(56) References Cited

U.S. PATENT DOCUMENTS

| 10,323,884 B2 * | 6/2019 | Yee .......................... F28F 3/042 |
| 2007/0164349 A1 * | 7/2007 | Nakasato ............ H01L 21/6835 257/318 |

(Continued)

FOREIGN PATENT DOCUMENTS

| JP | 11-046049 A | 2/1999 |
| KR | 10-2008-0028258 A | 3/2008 |

(Continued)

OTHER PUBLICATIONS

International Search Report dated Jan. 4, 2019 in International Application No. PCT/KR2018/010985.

*Primary Examiner* — Hoa C Nguyen
(74) *Attorney, Agent, or Firm* — Saliwanchik, Lloyd & Eisenschenk

(57) ABSTRACT

A circuit board according to an embodiment of the present invention comprises: a first metal layer; an insulating layer disposed on the first metal layer and comprising boron nitride agglomerate particles coated with a resin; and a second metal layer disposed on the insulating layer, wherein: one of both surfaces of the first metal layer, on which the insulating layer is disposed, is in at least partial contact with one surface of the insulating layer; one of both surfaces of the second metal layer, on which the insulating layer is disposed, is in at least partial contact with the other surface of the insulating layer; a plurality of grooves are formed on a surface which is one of both surfaces of at least one of the first metal layer and the second metal layer and which has the insulating layer disposed thereon; at least some of the particles are arranged in at least some of the plurality of (Continued)

grooves; the width (W) of at least one of the plurality of grooves is 1 to 1.8 times D50 of the particles; and a ratio (D/W) of the depth (D) to the width (W) of at least one of the plurality of grooves is 0.2 to 0.3.

20 Claims, 11 Drawing Sheets

(51) Int. Cl.
*C08K 3/38* (2006.01)
*C08K 9/06* (2006.01)
*C09C 1/00* (2006.01)
*C09C 3/12* (2006.01)
*H01L 33/64* (2010.01)
*H05K 1/02* (2006.01)
*H05K 3/46* (2006.01)

(52) U.S. Cl.
CPC .............. *C09C 3/12* (2013.01); *H01L 33/641* (2013.01); *H01L 33/647* (2013.01); *H05K 1/0204* (2013.01); *H05K 1/0306* (2013.01); *H05K 1/09* (2013.01); *H05K 3/4644* (2013.01); *C01P 2004/24* (2013.01); *C01P 2004/50* (2013.01); *C01P 2004/54* (2013.01); *C08K 2003/385* (2013.01); *C08K 2201/002* (2013.01); *H05K 2201/0162* (2013.01); *H05K 2201/0195* (2013.01); *H05K 2201/09036* (2013.01)

(56) References Cited

U.S. PATENT DOCUMENTS

| 2008/0118706 | A1  | 5/2008  | Schulz-Harder |
|---|---|---|---|
| 2011/0214853 | A1* | 9/2011  | Robichaux ............... E21B 33/05 166/66 |
| 2011/0232953 | A1* | 9/2011  | Oga ..................... H05K 3/4602 174/258 |
| 2013/0062045 | A1* | 3/2013  | Chu ..................... H05K 1/0373 165/185 |
| 2014/0349105 | A1* | 11/2014 | Yamazaki ............. C01B 35/146 428/323 |
| 2015/0296613 | A1* | 10/2015 | Matsui ................... H05K 1/181 174/255 |

FOREIGN PATENT DOCUMENTS

KR 10-2011-0122225 A 11/2011
KR 10-2014-0103106 A 8/2014

* cited by examiner

CIRCUIT BOARD

CROSS-REFERENCE TO RELATED APPLICATIONS

This application is the U.S. national stage application of International Patent Application No. PCT/KR2018/010985, filed Sep. 18, 2018, which claims the benefit under 35 U.S.C. § 119 of Korean Patent Application No. 10-2017-0121885, filed Sep. 21, 2017, the disclosures of each of which are incorporated herein by reference in their entirety.

TECHNICAL FIELD

The present invention relates to a circuit board.

BACKGROUND ART

Light-emitting devices including light-emitting elements such as light-emitting diodes (LEDs) are used as various light sources. With the development of semiconductor technology, a high output of the light-emitting devices is becoming accelerated. In order to stably cope with a large amount of light and heat emitted from such a light-emitting device, heat dissipation performance in the light-emitting device is required.

In addition, as electronic components become highly integrated and have higher performance, there is a growing interest in heat dissipation solutions of printed circuit boards on which the electronic components are mounted. In addition, there is a growing interest in heat dissipation solutions of semiconductor elements, ceramic substrates, and the like.

In general, resin compositions including resins and inorganic fillers may be used for heat dissipation of light-emitting elements, printed circuit boards, semiconductor elements, and ceramic substrates.

Here, the inorganic filler may include boron nitride. Boron nitride has excellent heat conductivity and heat dissipation performance and has excellent electrical insulation performance due to a high electrical resistance value thereof. However, boron nitride has a problem of anisotropic heat conductivity. In order to solve the problem, a boron nitride agglomerate of plate-shaped boron nitride may be used.

FIG. 1 illustrates an example of manufacturing a printed circuit board using a resin composition including boron nitride agglomerates, FIG. 2 is a cross-sectional view illustrating an example of a printed circuit board, and FIG. 3 is a cross-sectional view illustrating another example of a printed circuit board.

Referring to FIGS. 1 and 2, an insulating layer 20 in a paste state is stacked on a first metal layer 10, a second metal layer 30 is stacked on the insulating layer 20, and then, heating and pressing are performed thereon. The insulating layer 20 may include resin compositions including boron nitride agglomerates 22.

When a certain pressure or more is applied to bond the first metal layer 10 and the second metal layer 30 to the insulating layer 20, some of the boron nitride agglomerates 22 included in the insulating layer 20 are broken. As a result, heat dissipation performance of the printed circuit board is lowered.

In addition, due to a particle size of the boron nitride agglomerate 22, at least some of the boron nitride agglomerates 22 may protrude from a surface of the insulating layer 20. Accordingly, the first metal layer 10 and the second metal layer 20 are easily torn, bond strengths between the insulating layer 20 and the first and second metal layers 10 and 20 are weak and due to a stepped surface portion of the insulating layer 20, it is difficult to mount components.

In order to solve such problems, as shown in FIG. 3, there is an attempt of further stacking a planarization layer 40 on both surfaces of an insulating layer 20 and then stacking a first metal layer 10 and a second metal layer 30. In this case, although the first metal layer 10 and the second metal layer 30 may be bonded onto flat surfaces, heat conductivity of a printed circuit board may be considerably decreased due to the planarization layer 40.

DISCLOSURE

Technical Problem

The present invention is directed to providing a substrate having high heat dissipation performance and high bond strength.

Technical Solution

According to one embodiment of the present invention, a circuit board includes a first metal layer, an insulating layer disposed on the first metal layer and including particles in which a boron nitride agglomerate is coated with a resin, and a second metal layer disposed on the insulating layer, wherein at least a portion of one surface of both surfaces of the first metal layer, on which the insulating layer is disposed, is in contact with one surface of the insulating layer, at least a portion of one surface of both surfaces of the second metal layer, on which the insulating layer is disposed, is in contact with the other surface of the insulating layer, a plurality of grooves are formed in the one surfaces of the both surfaces of at least one of the first metal layer and the second metal layer, on which the insulating layer is disposed, at least a portion of each of the particles is disposed in at least a portion of each of the plurality of grooves, a width (W) of at least one of the plurality of grooves is 1 to 1.8 times a D50 of the particle, and a ratio (D/W) of a depth (D) to the width (W) of the at least one of the plurality of grooves ranges from 0.2 to 0.3.

The at least one of the plurality of grooves may include a wall surface disposed in a direction of the depth (D) and a bottom surface connected to the wall surface.

The bottom surface may have a concave shape.

The bottom surface may be formed such that the depth (D) is gradually increased in a direction from an edge to a center of the width.

A cross section of the bottom surface may have a curved shape.

The wall surface may be provided as a plurality of wall surfaces, and a first wall surface of the plurality of wall surfaces may form a certain angle with respect to a second wall surface adjacent to the first wall surface.

The wall surface may be provided as six wall surfaces.

The one surfaces of the both surfaces of the first metal layer and the both surfaces of the second metal surface, in which the plurality of grooves are formed, may have a honeycomb shape.

At least one of the first metal layer and the second metal layer may include copper (Cu) and may have a circuit pattern.

The insulating layer may be in direct contact with at least one of the first metal layer and the second metal layer.

A thickness of the insulating layer may be 1 to 2 times the D50 of the particle.

The boron nitride agglomerate may include an agglomerate in which a plurality of plate-shaped boron nitride compounds agglomerate together, and a coating layer formed on the agglomerate. The coating layer may include a polymer having a monomer below.

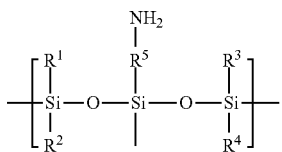

Here, one of $R^1$, $R^2$, $R^3$, and $R^4$ is hydrogen (H), the remainder thereof are each selected from the group consisting of $C_1$-$C_3$ alkyl, $C_2$-$C_3$ alkene, and $C_2$-$C_3$ alkyne, and $R^5$ is a linear, branched, or cyclic divalent organic linker having one to twelve carbon atoms.

The insulating layer may include the resin in an amount ranging from 15 vol % to 35 vol % and the boron nitride agglomerate in an amount ranging from 65 vol % to 85 vol %.

According to one embodiment of the present invention, a circuit board includes a first metal layer, an insulating layer disposed on the first metal layer, and a second metal layer disposed on the insulating layer, wherein at least a portion of one surface of both surfaces of the first metal layer, on which the insulating layer is disposed, is in contact with one surface of the insulating layer, at least a portion of one surface of both surfaces of the second metal layer, on which the insulating layer is disposed, is in contact with the other surface of the insulating layer, a plurality of protrusions are formed on at least one of both surfaces of the insulating layer, a plurality of recesses are formed in the one surfaces of the first metal layer and the both surfaces of the second metal layer, which are in contact with the plurality of protrusions, at least a portion of each of the protrusions is disposed in at least a portion of each of the plurality of recesses, and a ratio (D/W) of a depth (D) to a width (W) of at least one of the plurality of recesses ranges from 0.2 to 0.3.

The insulating layer may include particles in which an inorganic filler is coated with a resin, and at least some of the plurality of protrusions may be the particles.

Advantageous Effects

According to embodiments of the present invention, a substrate having excellent heat dissipation performance can be obtained. In addition, the substrate according to the embodiments of the present invention has high bond strength between an insulating layer and a copper layer, and components are easily mounted thereon.

MODES OF THE INVENTION

Figure 1:
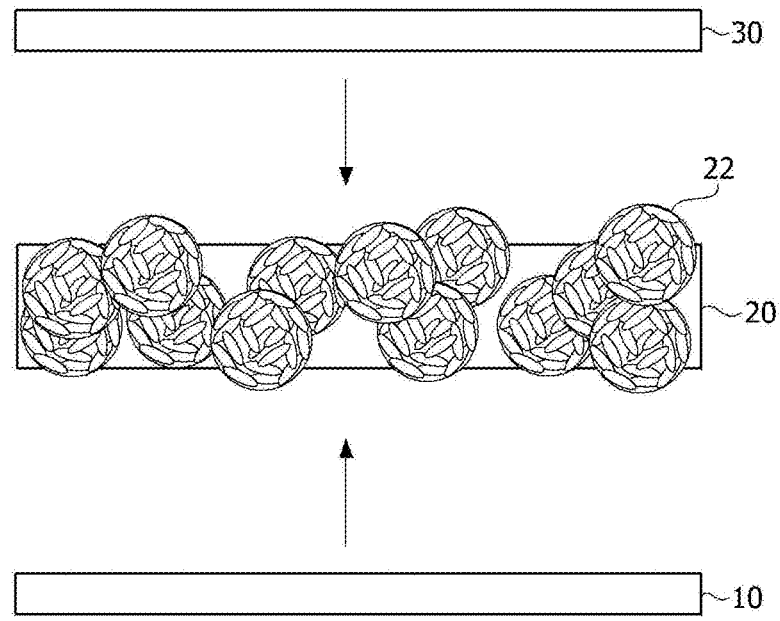
FIG. 1 illustrates an example of manufacturing a printed circuit board using a resin composition including boron nitride agglomerates.
Figure 2:
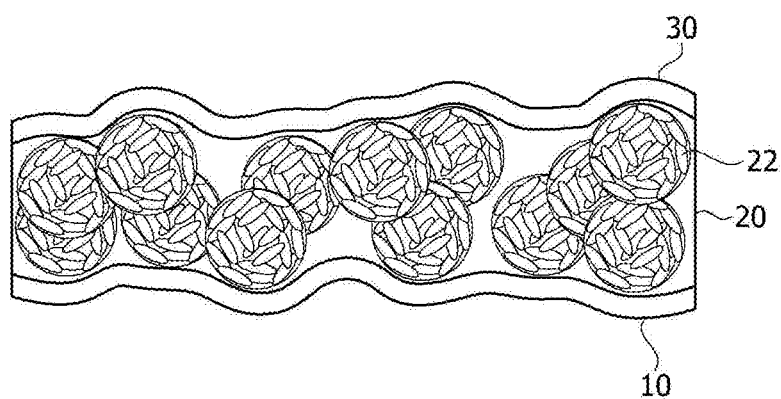
FIG. 2 is a cross-sectional view illustrating an example of a printed circuit board.
Figure 3:
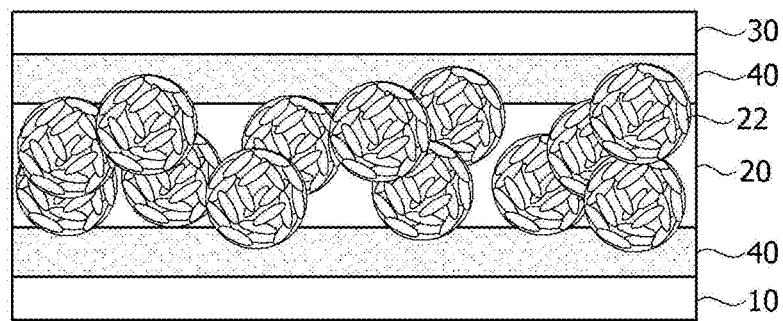
FIG. 3 is a cross-sectional view illustrating another example of a printed circuit board.

While the present invention is open to various modifications and alternative embodiments, specific embodiments thereof will be described and shown by way of example in the drawings. However, it should be understood that there is no intention to limit the present invention to the particular embodiments disclosed, and, on the contrary, the present invention is to cover all modifications, equivalents, and alternatives falling within the spirit and scope of the present invention.

It should be understood that, although the terms including ordinal numbers such as first, second, and the like may be used herein to describe various elements, the elements are not limited by the terms. The terms are used only for the purpose of distinguishing one element from another. For example, without departing from the scope of the present invention, a second element could be termed a first element, and similarly a first element could be also termed a second element. The term "and/or" includes any one or all combinations of a plurality of associated listed items.

It is to be understood that terms used herein are for the purpose of description of particular embodiments and not for limitation. A singular expression includes a plural expression unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art and should not be interpreted in an idealized or overly formal sense unless expressly defined otherwise herein.

It will be understood that when an element such as a layer, film, region, or substrate is referred to as being "on" another element, it can be directly on another element or intervening elements may also be present. In contrast, when an element is referred to as being "directly on" another element, there are no intervening elements present.

Hereinafter, embodiments will be described in detail with reference to the accompanying drawings, and the same or corresponding elements will be given the same reference numbers regardless of drawing symbols, and redundant descriptions will be omitted.

Figure 4:
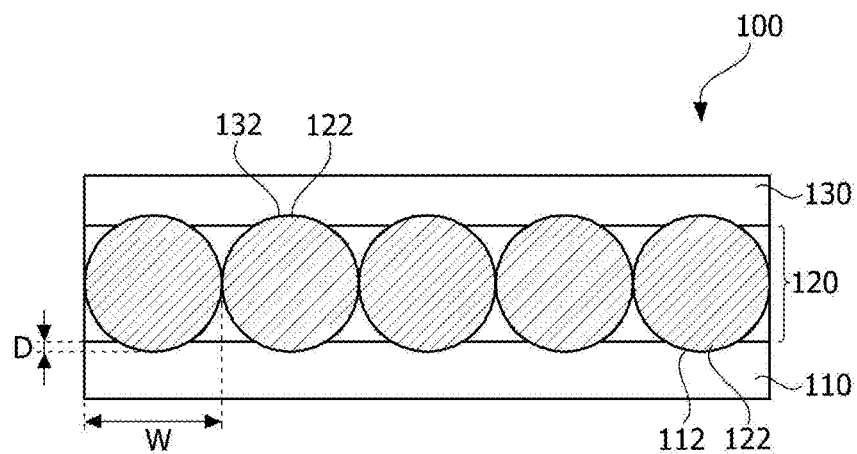
FIG. 4 is a cross-sectional view of a substrate according to one embodiment of the present invention.
Figure 5:
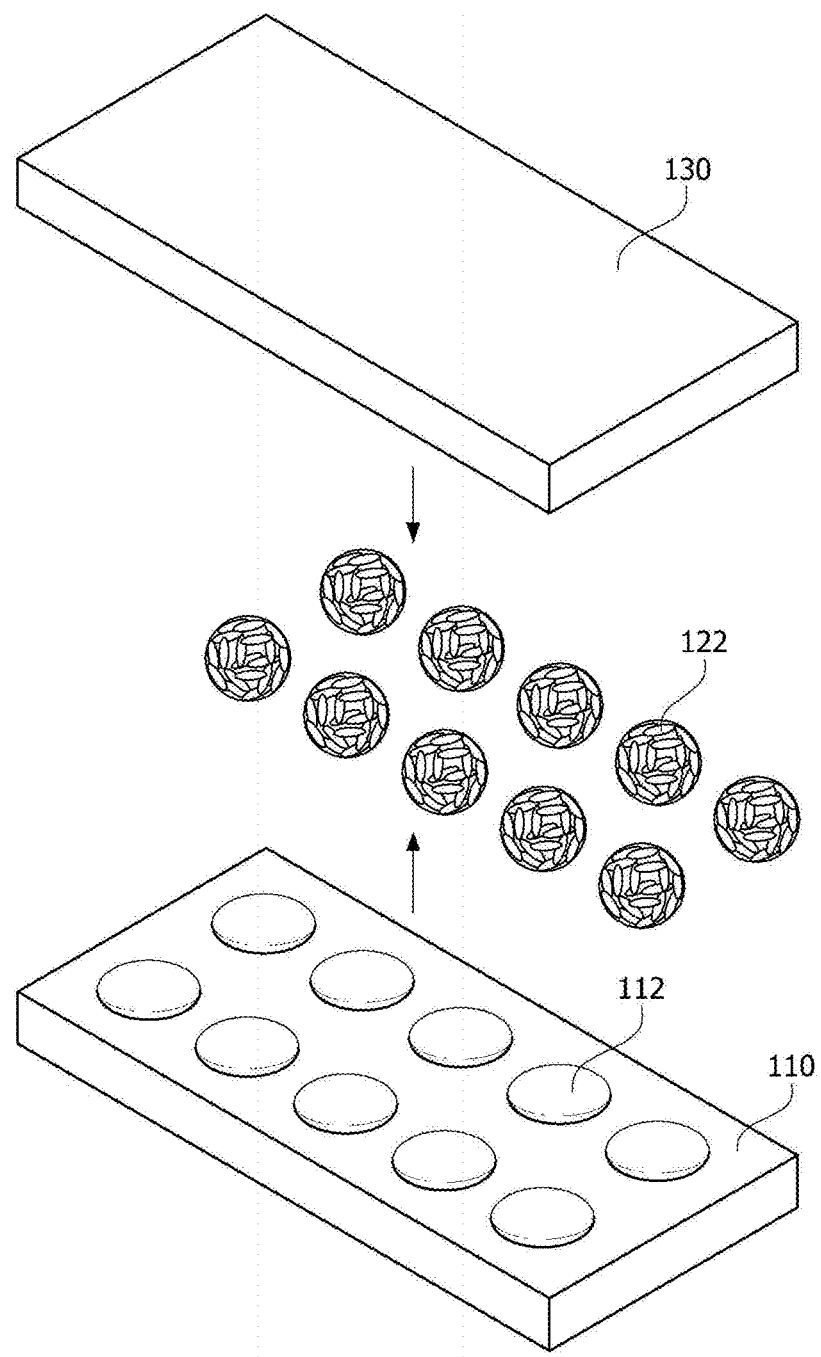
FIG. 5 illustrates a method of manufacturing a substrate according to one embodiment of the present invention.

FIG. 4 is a cross-sectional view of a substrate according to one embodiment of the present invention, and FIG. 5 illustrates a method of manufacturing a substrate according to one embodiment of the present invention.

Referring to FIG. 4, a circuit board 100 according to one embodiment of the present invention includes a first metal layer 110, an insulating layer 120 disposed on the first metal layer 110, and a second metal layer 130 disposed on the insulating layer 120. Here, the first metal layer 110 and the second metal layer 130 may include copper (Cu) or nickel (Ni) and may have circuit patterns.

A plurality of protrusions 122 are formed on both surfaces of the insulating layer 120. A plurality of recesses 112 are formed in a surface of both surfaces of the first metal layer 110 on which the insulating layer 120 is disposed. A plurality of recesses 132 are formed in a surface of both surfaces of the second metal layer 130 on which the insulating layer 120 is disposed. In the present specification, the recess may be used interchangeably with a groove.

At least portions of each of the plurality of protrusions 122 formed in the insulating layer 120 may be disposed in at least a portion of each of the plurality of recesses 112 formed in the first metal layer 110 and in at least a portion of each of the plurality of recesses 132 formed in the second metal layer 130.

Here, the insulating layer 120 may include particles in which an inorganic filler is coated with a resin. In this case, the inorganic filler may include a boron nitride agglomerate, and the boron nitride agglomerate may be an agglomerate in which a plurality of plate-shaped boron nitride compounds agglomerate together, and the resin may be an epoxy resin.

The particle may have a spherical shape having a diameter ranging from 20 μm to 400 μm. At least some of the particles may protrude from a surface of the cured insulating layer 120 to form protrusions.

According to the embodiments of the present invention, the recesses 112 and 132 are preformed in one surface of the first metal layer 110 and one surface of the second metal layer 130 to accommodate the protrusions of the insulating layer 120. To this end, the shape and size of the recesses 112 and 132 formed in one surface of the first metal layer 110 and one surface of the second metal layer 130 may correspond to the shape of the protrusion 122.

As described above, when the protrusions 122 of the insulating layer 120, that is, the particles, are accommodated in the recesses 112 and 132 preformed in the first metal layer 110 and the second metal layer 130, the first metal layer 110 and the second metal layer 130 may be in direct contact with the particles included in the insulating layer 120 to increase contact areas between the insulating layer 120 and the first and second metal layers 110 and 130. Accordingly, the circuit board 100 may have high heat conductivity. In addition, since grooves for accommodating the protrusions 122 of the insulating layer 120 are preformed in the first metal layer 110 and the second metal layer 130, in a pressing process for bonding the first metal layer 110, the insulating layer 120, and the second metal layer 130, it is possible to inhibit the first metal layer 110 and the second metal layer 130 from being torn, it is possible to inhibit the boron nitride agglomerate from being broken, and it is possible to minimize stepped portions being formed on the surfaces of the first metal layer 110 and the second metal layer 130 due to the protrusions of the insulating layer 120.

In this case, a thickness of the insulating layer 120 may be 1 to 2 times and preferably 1 to 1.8 times a D50 of the particle. D50 may means a particle diameter corresponding to a weight percentage of 50%, that is, a particle diameter corresponding to 50% of passed mass percentage in a particle size distribution curve and may refer to an average particle diameter.

When the thickness of the insulating layer 120 is less than one times of the D50 of the particle, the insulating layer 120 may not be formed to be thick enough to accommodate the particles, and thus, the particles may not be uniformly distributed. When the thickness of the insulating layer 120 exceeds twice the D50 of the particle, an amount of the particles protruding from the surface of the insulating layer 120 is reduced. Thus, contact areas between the insulating layer 120 and the first and second metal layers 110 and 130 may be reduced to lower heat conductivity.

In order to manufacture such a substrate, referring to FIG. 5, a first metal layer 110 including a plurality of recesses 112 formed in one surface thereof is provided, and an insulating layer 120 in a particle state, in which a boron nitride agglomerate is coated with a resin, is disposed on the first metal layer 110. Here, the insulating layer 120 in the particle state may include particles in a state in which a boron nitride agglomerate is coated with a resin. Alternatively, the insulating layer 120 in the particle state may include particles in which a boron nitride agglomerate including an amino group formed therein is further coated with an epoxy resin. The second metal layer 130 including a plurality of recesses 132 formed therein is stacked on the insulating layer 120, and then, heating and curing are performed to cure the stacked layers. Since the insulating layer 120 is in a particle state in which a boron nitride agglomerate is coated with an epoxy resin, the boron nitride agglomerate included in the insulating layer 120 may be accommodated in the recess 112 of the first metal layer 110 and the recess 132 of the second metal layer 130 and then may be cured in a curing operation.

According to the embodiments of the present invention, the plurality of recesses 112 formed in the first metal layer 110 and the plurality of recesses 132 formed in the second metal layer 130 may have preformed to have certain patterns.

FIGS. 6A-6D illustrate various examples of recesses of a first metal layer and a second metal layer according to one embodiment of the present invention.

Referring to FIGS. 6A-6D, recesses 112 of a first metal layer 110 and recesses 132 of a second metal layer 130 may have the same pattern. For example, a plurality of recesses 112 and 132 having a circular pattern may be disposed in the first metal layer 110 and the second metal layer 130.

Figures 6A, 6B, 6C, 6D:
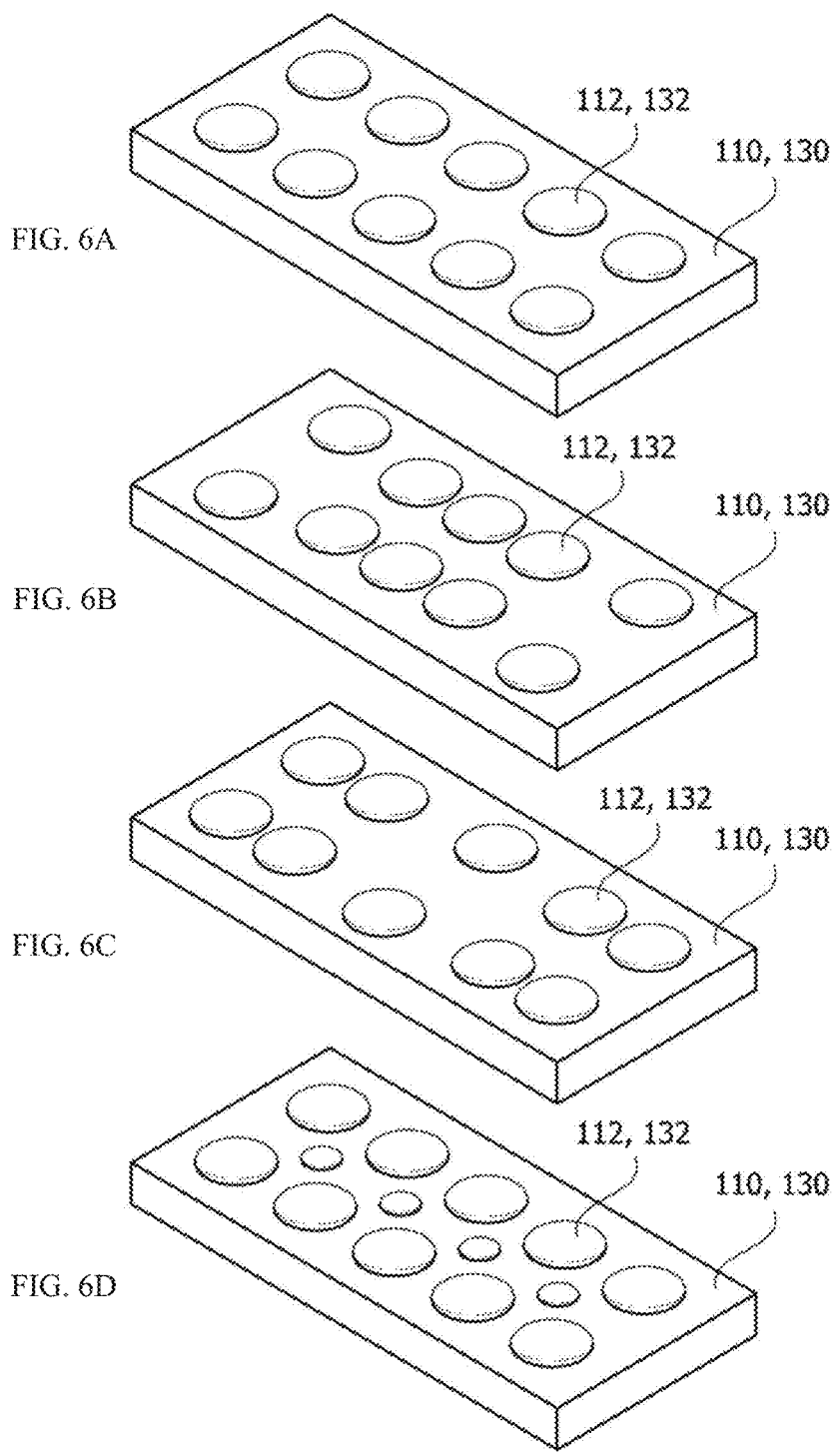
FIGS. 6A-6D illustrate various examples of recesses of a first metal layer and a second metal layer according to one embodiment of the present invention.

For example, referring to FIG. 6A, the recesses 112 and 132 of the first metal layer 110 and the second metal layer 130 have the same size and may be formed in a regular pattern at certain intervals. As described above, when the recesses 112 and 132 are formed in the regular pattern, particles may be uniformly distributed even in the vicinity of boundaries between the second insulating layer 120 and the first and second metal layers 110 and 130. As a result, it is possible to obtain a uniform heat conductivity distribution.

Alternatively, referring to FIGS. 6B and 6C, the recesses 112 and 132 of the first metal layer 110 and the second metal layer 130 have the same size but may be disposed such that densities thereof are different according to positions. That is, as shown in FIG. 6B, the density of the recesses 112 and 132 disposed at an edge position is lower than the density of the recesses 112 and 132 disposed at a central position, or as shown in FIG. 6C, the density of the recesses 112 and 132 disposed at an edge position may be higher than the density of the recesses 112 and 132 disposed in a central position. As described above, when the recesses 112 and 132 are disposed such that the densities thereof are different according to positions, a density of particles in the insulating layer 120 may be adjusted according to the positions, thereby obtaining a heat conductivity distribution suitable for various needs.

Alternatively, referring to FIG. 6D, the recesses 112 and 132 of the first metal layer 110 and the second metal layer 130 may be formed in a pattern in which recesses having different sizes are mixed. Accordingly, the insulating layer 120 may also be applied to a case of including various types of particles having different sizes.

Figure 7A:
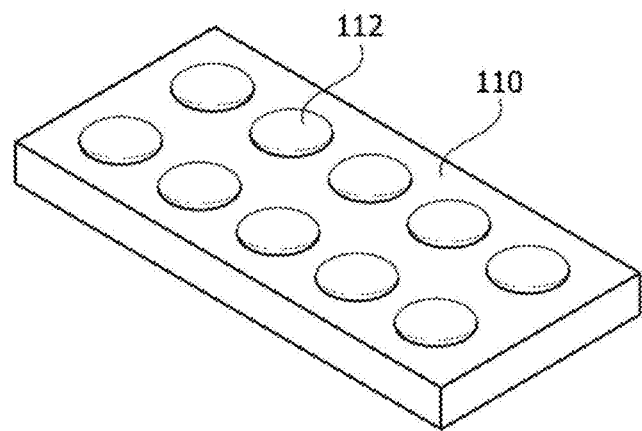
FIGS. 7A-7B illustrate examples of recesses of a first metal layer and a second metal layer according to another embodiment of the present invention.
Figure 7B:
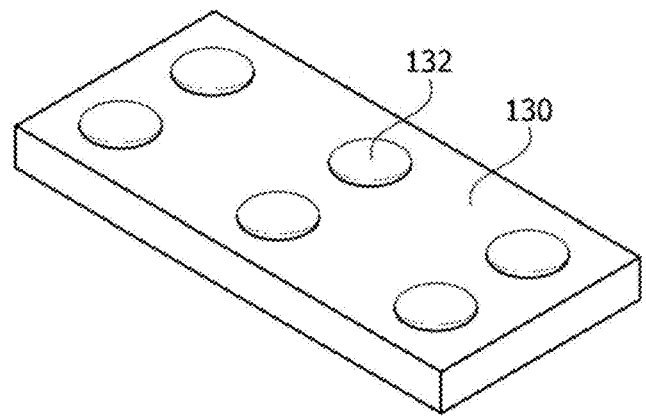

FIGS. 7A-7B illustrate examples of recesses of a first metal layer and a second metal layer according to another embodiment of the present invention.

Referring to FIGS. 7A-7B, recesses 112 of a first metal layer 110 and recesses 132 of a second metal layer 130 may have different patterns. For example, due to gravity, a density of particles may become gradually higher in a downward direction. In order to accommodate such particles, a density of the recesses 112 of the first metal layer 110 may be higher than a density of the recesses 132 of the second metal layer 130.

Figure 8:
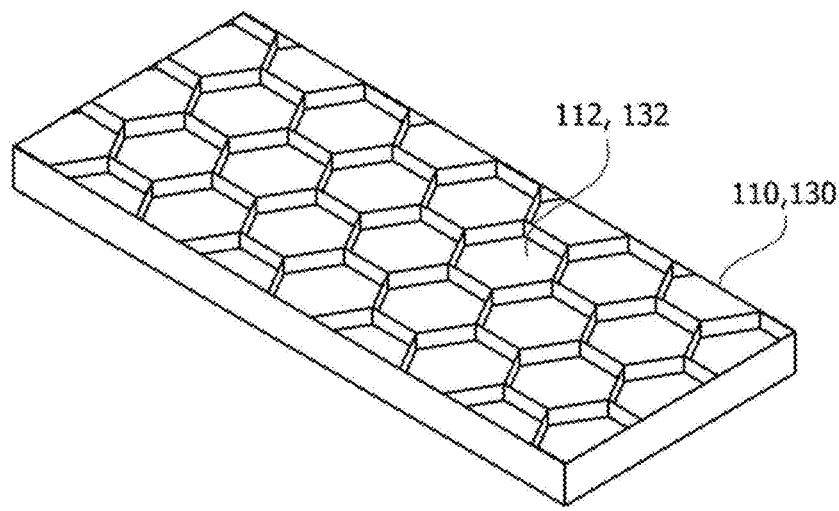
FIG. 8 illustrates an example of recesses of a first metal layer and a second metal layer according to still another embodiment of the present invention.

FIG. 8 illustrates examples of recesses of a first metal layer and a second metal layer according to still another embodiment of the present invention.

Referring to FIG. 8, a plurality of recesses 112 and 132 having a polygonal-shaped pattern, for example, a hexagonal-shaped pattern, may be disposed in a first metal layer 110 and a second metal layer 130. Accordingly, at least one of one surface of both surfaces of the first metal layer 110 and one surface of both surfaces of the second metal layer 130 may have a honeycomb shape.

Even in the embodiment of FIG. 8, as described with reference to FIGS. 6A-6D, the recesses 112 of the first metal layer 110 and the recesses 132 of the second metal layer 130 have the same pattern, or as described with reference to FIGS. 7A-7B, the recesses 112 of the first metal layer 110 and the recesses 132 of the second metal layer 130 may have different patterns. In addition, as described with reference to FIGS. 6A-6D, the recesses 112 of the first metal layer 110 or the recesses 132 of the second metal layer 130 may have the same size and be regularly formed at certain intervals or may have the same size and be disposed such that densities or sizes thereof are different according to positions.

Figure 9A:
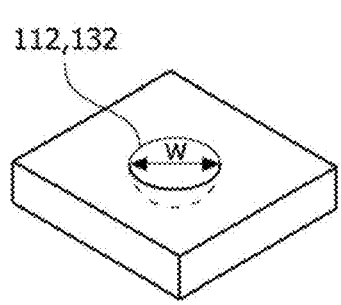
FIGS. 9A-9C show enlarged views illustrating recesses according to embodiments of the present invention.
Figure 9B:
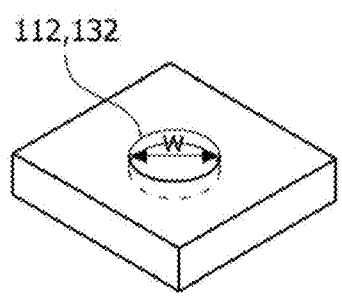
Figure 9C:
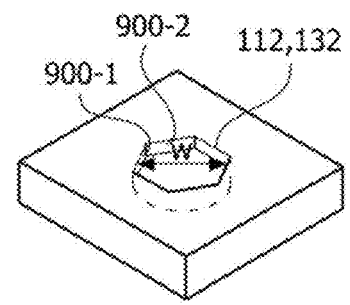
Figure 10A:
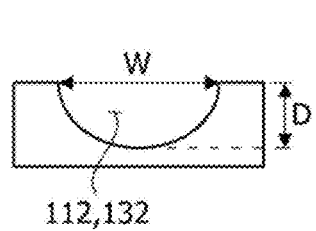
FIGS. 10A-10C show cross-sectional views of the recesses of FIG. 9.
Figure 10B:
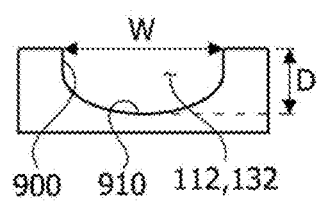
Figure 10C:
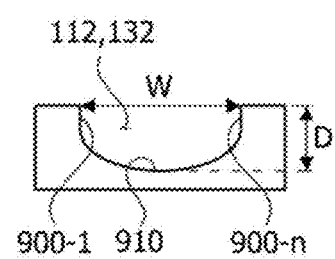

FIGS. 9A-9C show enlarged views illustrating recesses according to embodiments of the present invention, and FIGS. 10A-10C show cross-sectional views of the recesses of FIGS. 9A-9C.

Referring to FIG. 9A, recesses 112 and 132 may have a partial shape of a sphere having a certain width W and depth D. That is, as shown in FIGS. 6A-6D and FIGS. 7A-7B, an upper surface of the recess 112 or 132 may have a circular shape, and a side cross section of the recess 112 or 132 may have a curved shape which leads from a surface of the first metal layer 110 or the second metal layer 130.

Referring to FIG. 9B, recesses 112 and 132 may have a certain width W and depth D and may include a wall surface 900 disposed in the direction of a depth D of the first metal layer 110 and the second metal layer 130 and a bottom surface 910 disposed in the direction of a width W of the first metal layer 110 and the second metal layer 130 and connected to the wall surface 900. In this case, as shown in FIGS. 6A-6D and FIGS. 7A-7B, an upper surface of the recess 112 or 132 may have a circular shape, the wall surface 900 of the recess 112 or 132 may have a shape of an outer circumferential surface of a cylinder, and the bottom surface 910 of the recess 112 or 132 may have a concave shape. That is, the bottom surface 910 may be formed such that the depth D is gradually increased in a direction from an edge to a center of the recess 112 or 132. Accordingly, a side cross section of the recess 112 or 132 may have a linear shape which leads from a surface of the first metal layer 110 or the second metal layer 130 in the direction of the depth D and a curved shape which leads from the wall surface 900 of the recess 112 or 132 to form the bottom surface 910.

Referring to FIG. 9C, recesses 112 and 132 may have a certain width W and depth D and may include a plurality of wall surfaces 900-1 to 900-$n$ disposed in the direction of a depth D of the first metal layer 110 and the second metal layer 130 and a bottom surface 910 disposed in the direction of a width W of the first metal layer 110 and the second metal layer 130 and connected to the wall surfaces 900-1 and 900-$n$. In this case, a first wall surface 900-1 of the plurality of wall surfaces may form a certain angle with respect to a second wall surface 900-2 adjacent to the first wall surface 900-1. That is, as shown in FIG. 8, an upper surface of the recess 112 or 132 may have a polygonal shape, for example, a hexagonal shape, and thus, the recess 112 or 132 may have six wall surfaces. In this case, the plurality of wall surfaces of the recess 112 or 132 may have a shape of an outer circumferential surface of a hexagonal pillar, and the bottom surface 910 of the recess 112 or 132 may have a concave shape. That is, the bottom surface 910 may be formed such that the depth D is gradually increased in a direction from an edge to a center of the recess 112 or 132. Accordingly, a side cross section of the recess 112 or 132 may have a linear shape which leads from a surface of the first metal layer 110 or the second metal layer 130 in the direction of the depth D and a curved shape which leads from the wall surface of the recess 112 or 132 to form the bottom surface 910.

When the bottom surface 910 of the recess 112 or 132 has a concave shape, the recess 112 or 132 may stably accommodate a protrusion 122, and contact areas between the protrusion 122 and the recesses 112 and 132 may be widened, thereby increasing heat conductivity.

Meanwhile, according to the embodiments of the present invention, the width W of the recesses 112 and 132 may range from 1 to 1.8 times, preferably range from 1 to 1.4 times, and more preferably range from 1 to 1.2 times a D50 of a particle. A ratio D/W of the depth D to the width W of the recesses 112 and 132 may range from 0.2 to 0.3 and preferably range from 0.2 to 0.25. When the width W of the recesses 112 and 132 is less than one times of the D50 of the particle, the protrusion 122 of the insulating layer 120 may not be easily disposed in the recesses 112 and 132. Thus, due to the recesses 112 and 132, rather, pores may be formed, and heat conductivity may be lowered. When the width W of the recesses 112 and 132 exceeds 1.8 times a D50 of an inorganic filler, one or more particles may be disposed to be recessed in the recesses 112 and 132. When a recess in which one particle is accommodated and a recess in which one or more particles are accommodated are non-uniformly disposed, a measured thermal conductivity deviation may appear to be great, which may affect reliability of a product.

As described above, the insulating layer 120 according to the embodiments of the present invention includes particles in which an inorganic filler is coated with a resin. Here, the resin may include an epoxy compound and a curing agent. In this case, the curing agent may be included at 1 to 10 parts by volume with respect to 10 parts by volume of the epoxy compound. In the present specification, an epoxy compound may be used interchangeably with an epoxy-based resin.

Here, the epoxy compound may include at least one selected from among a crystalline epoxy compound, an amorphous epoxy compound, and a silicon epoxy compound.

The crystalline epoxy compound may include a mesogen structure. A mesogen is a basic unit of a liquid crystal and includes a rigid structure.

The amorphous epoxy compound may be a conventional amorphous epoxy compound having two or more epoxy groups in a molecule, for example, a glycidyl ether compound derived from bisphenol A or bisphenol F.

Here, the curing agent may include at least one selected from among an amine-based curing agent, a phenol-based curing agent, an acid anhydride-based curing agent, a polymercaptan-based curing agent, a polyaminoamide-based curing agent, an isocyanate-based curing agent, and a block isocyanate-based curing agent and may use a mixture of two or more curing agents.

Figure 11A:
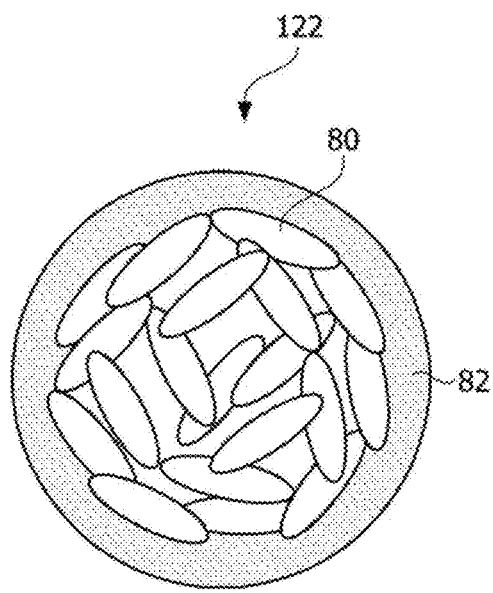
FIGS. 11A-11B illustrate boron nitride agglomerates coated with a resin according to one embodiment of the present invention.
Figure 11B:
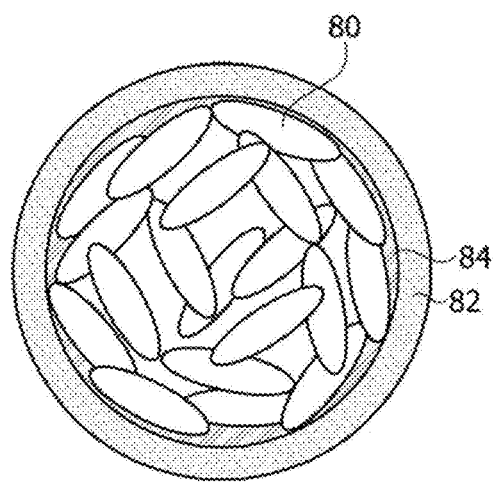

The inorganic filler may include boron nitride agglomerates in which a plurality of plate-shaped boron nitride compounds agglomerate together. FIGS. 11A-11B illustrate particles according to one embodiment of the present invention. Referring to FIG. 11A, a resin 82 may be applied on surfaces of agglomerates 80 in which a plurality of plate-shaped boron nitride compounds agglomerate together. The resin 82 may include an epoxy compound and a curing agent. Referring to FIG. 11B, a coating layer 84 is formed on the surfaces of the agglomerates 80 in which the plurality of plate-shaped boron nitride compounds agglomerate together, and the resin 82 may be further applied on the coating layer 84. The coating layer 84 may include a polymer having Monomer 1 below. The polymer having Monomer 1 below may fill at least some of pores in the boron nitride agglomerate.

That is, Monomer 1 is as follows.

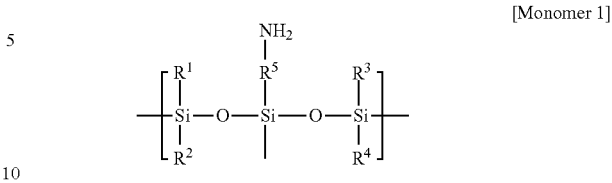

[Monomer 1]

Here, one of $R^1$, $R^2$, $R^3$, and $R^4$ may be hydrogen (H), the remainder thereof may each be selected from the group consisting of $C_1$-$C_3$ alkyl, $C_2$-$C_3$ alkene, and $C_2$-$C_3$ alkyne, and $R^5$ may be a linear, branched, or cyclic divalent organic linker having one to twelve carbon atoms.

In one embodiment, among $R^1$, $R^2$, $R^3$, and $R^4$, one of the remainder excluding H may be selected from $C_2$-$C_3$ alkene, and another one and still another one of the remainder may be selected from $C_1$-$C_3$ alkyl. For example, the polymer according to the embodiments of the present invention may include Monomer 2 below.

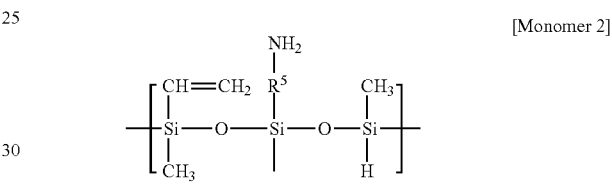

[Monomer 2]

Alternatively, among $R^1$, $R^2$, $R^3$, and $R^4$, the remainder excluding H may be differently selected from the group consisting of $C_1$-$C_3$ alkyl, $C_2$-$C_3$ alkene, and $C_2$-$C_3$ alkyne.

As described above, when the polymer according to the embodiments of the present invention is applied on agglomerates, in which plate-shaped boron nitride compounds agglomerate together, and fills at least some of pores in the agglomerate, an air layer in the agglomerate may be minimized to increase heat conductivity performance of the agglomerate, and a bonding force between the boron nitride compounds may be increased to inhibit the agglomerate from being broken. When a coating layer is formed on the agglomerates in which the plate-shaped boron nitride compounds agglomerate together, the formation of a functional group may be facilitated. When the functional group is formed on the coating layer of the agglomerate, an affinity with a resin may be increased.

In this case, the polymer according to the embodiments of the present invention may be formed from a reaction between polysilazane (PSZ) of Formula 1 and aminosilane.

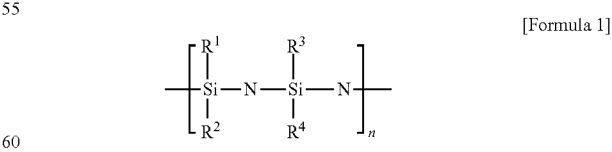

[Formula 1]

Here, one of $R^1$, $R^2$, $R^3$, and $R^4$ is H, the remainder thereof are selected from the group consisting of $C_1$-$C_3$ alkyl, $C_2$-$C_3$ alkene, and $C_2$-$C_3$ alkyne, and n is an positive integer.

In this case, among $R^1$, $R^2$, $R^3$, and $R^4$, the remainder excluding H may be selected from the group consisting of $C_1$-$C_3$ alkyl, $C_2$-$C_3$ alkene, and $C_2$-$C_3$ alkyne.

In one embodiment, among $R^1$, $R^2$, $R^3$, and $R^4$, one of the remainder excluding H may be selected from $C_2$-$C_3$ alkene, and another one and still another one of the remainder may be selected from $C_1$-$C_3$ alkyl. For example, among $R^1$, $R^2$, $R^3$, and $R^4$, one of the remainder excluding H may be —CH=CH$_2$, and another one and still another one of the remainder may be —CH$_3$.

In this case, a thickness of the coating layer 84 formed on the boron nitride agglomerate 80 may range from 1 µm to 2 µm. When the thickness of the coating layer is less than 1 µm, an amino group may not be sufficiently formed on the coating layer, and thus, peel strength may be lowered. When the thickness of the coating layer exceeds 2 µm, the boron nitride agglomerates may agglomerate together, and thus, heat conductivity may be lowered.

Here, an insulating layer according to the embodiments of the present invention may include a resin in an amount ranging from 15 vol % to 35 vol % and preferably in an amount ranging from 20 vol % to 30 vol % and an inorganic filler in an amount ranging from 65 vol % to 85 vol % and preferably in an amount ranging from 70 vol % to 80 vol %. When the resin and the inorganic filler are included in such numerical ranges, a resin composition having excellent heat conductivity and stability at room temperature may be obtained. In particular, when the inorganic filler including the boron nitride agglomerate according to one embodiment of the present invention is included in an amount exceeding 85 vol %, a content of the resin may be relatively reduced, and thus, fine pores may be formed between particles. Accordingly, rather, heat conductivity may be lowered, and peel strength and flexural strength may be lowered. In addition, when the inorganic filler including the boron nitride agglomerate according to one embodiment of the present invention is included in an amount less than 65 vol %, heat conductivity may be lowered.

Meanwhile, a substrate according to embodiments of the present invention may be applied to a light-emitting element as well as a printed circuit board.

Figure 12:
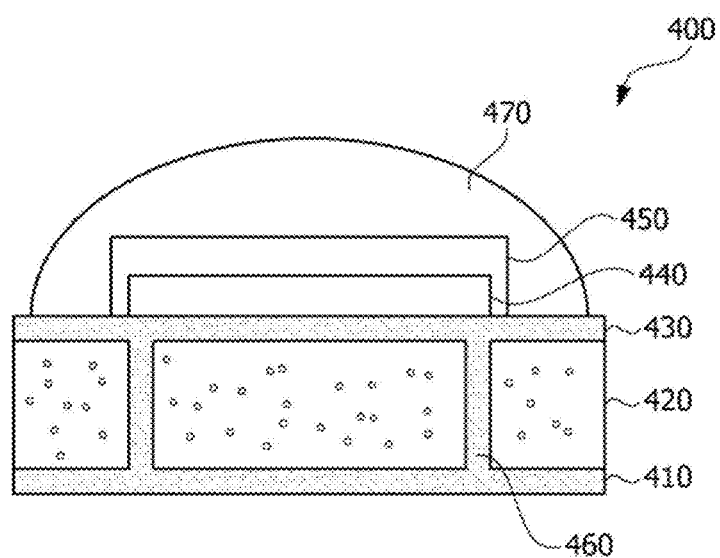
FIG. 12 is a cross-sectional view of a light-emitting element module according to one embodiment of the present invention.

FIG. 12 is a cross-sectional view of a light-emitting element module according to one embodiment of the present invention.

Referring to FIG. 12, a light-emitting element module 400 may include a lower line 410, an insulating layer 420 disposed on the lower line 410, an upper line 430 disposed on the insulating layer 420, a light-emitting element 440 disposed on the upper line 430, a phosphor layer 450 disposed on the light-emitting element 440, a via 460 connecting the lower line 410 and the upper line 430, and a lens 470. Here, the lower line 410, the insulating layer 420, and the upper line 430 may correspond to the first metal layer 110, the insulating layer 120, and the second metal layer 130 according to the embodiments of the present invention and may constitute a heat dissipation substrate.

Hereinafter, the present invention will be described in more detail using Examples and Comparative Examples.

Examples 1-1 to 1-3

An insulating layer in a particle state was stacked on a 0.3 mm thick first copper layer in which a plurality of recesses are formed, a 0.3 mm thick second copper layer in which a plurality of recesses are formed was stacked on the insulating layer, and then, heating and pressing were performed thereon. In this case, the insulating layer included an epoxy resin, which includes a bisphenol A epoxy compound and diaminodiphenyl sulfone in an equivalence ratio of 1:0.8, in an amount of 25 vol %, and a boron nitride agglomerate in an amount of 75 vol %. The insulating layer in a particle state, in which a D50 is 300 µm, was stacked at a thickness of 500 µm.

In Examples 1-1 and 1-2, each recess was formed to have a hexagonal shape as in a structure shown in FIGS. 8, 9C, and 10C, and in Example 1-3, each recess was formed to have a circular shape as in a structure shown in FIGS. 6A-6D, 9B, and 10B.

Comparative Examples 1-1 to 1-4

In Comparative Example 1-1, an insulating layer in a particle state was stacked on a 0.3 mm thick first copper layer in which a recess is not formed, a 0.3 mm thick second copper layer in which a recess is not formed was stacked on the insulating layer, and then, heating and pressing were performed thereon.

In Comparative Examples 1-2 to 1-8, an insulating layer in a particle state was stacked on a 0.3 mm thick first copper layer in which a plurality of recesses are formed, a 0.3 mm thick second copper layer in which a plurality of recesses are formed was stacked on the insulating layer, and then, heating and pressing were performed thereon. In this case, the insulating layer included an epoxy resin, which includes a bisphenol A epoxy compound and diaminodiphenyl sulfone in an equivalence ratio of 1:0.8, in an amount of 25 vol %, and a boron nitride agglomerate in an amount of 75 vol %. The insulating layer in a particle state, in which a D50 is 300 µm, was stacked at a thickness of 500 µm.

In Comparative Example 1-2, each recess was formed to have a hexagonal shape as in a structure shown in FIGS. 8, 9C, and 10C. In Comparative Examples 1-3 and 1-4, each recess was formed to have a rhombic shape. In Comparative Examples 1-5, 1-6, and 1-7, each recess was formed to have a circular shape as in a structure shown in FIGS. 6A-6D, 9B, and 10B. In Comparative Example 1-8, each recess was formed to have a dot shape.

Figure 13A:
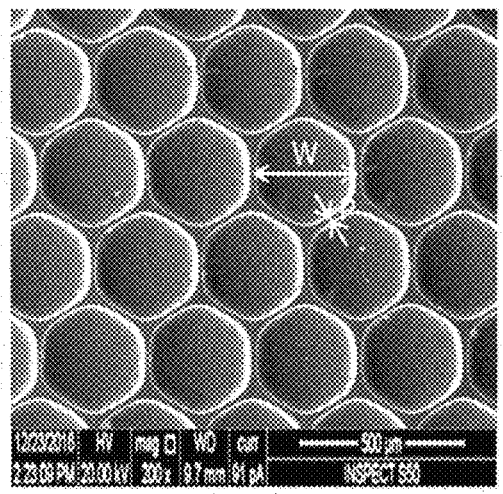
FIG. 13A shows images of an upper surface and a cross section of a metal layer formed according to Example 1-1.
Figure 13A:
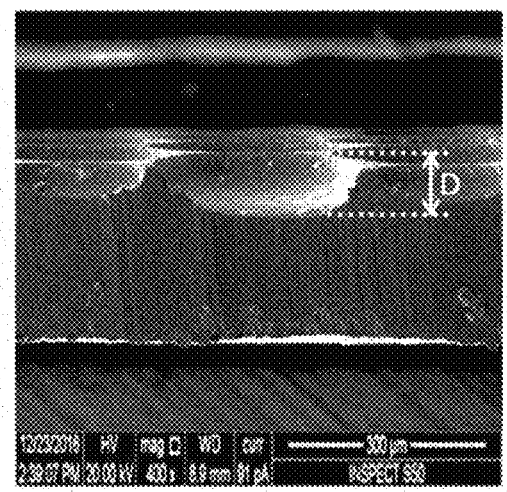
Figure 13B:
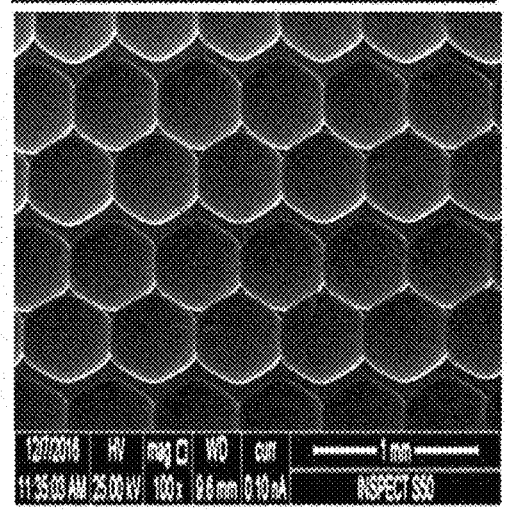
FIG. 13B shows images of an upper surface and a cross section of a metal layer formed according to Example 1-2.
Figure 13B:
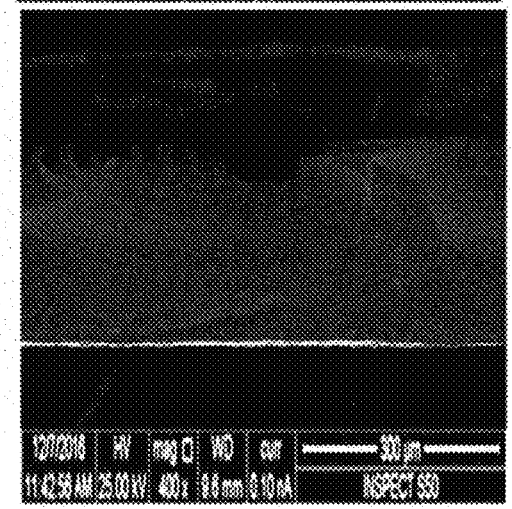
Figure 13C:
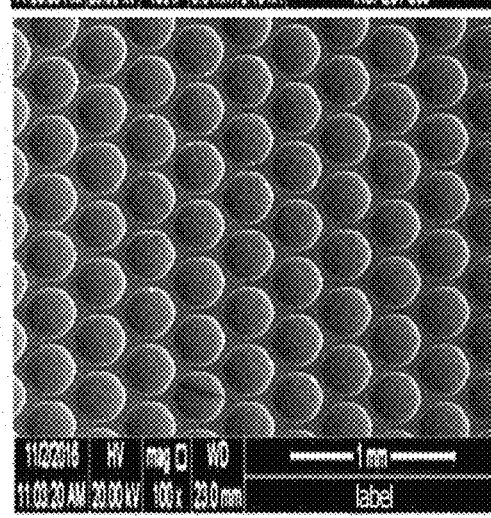
FIG. 13C shows images of an upper surface and a cross section of a metal layer formed according to Example 1-3.
Figure 13C:
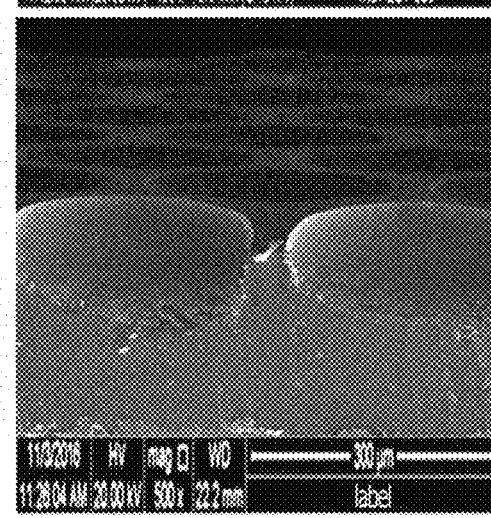
Figure 14A:
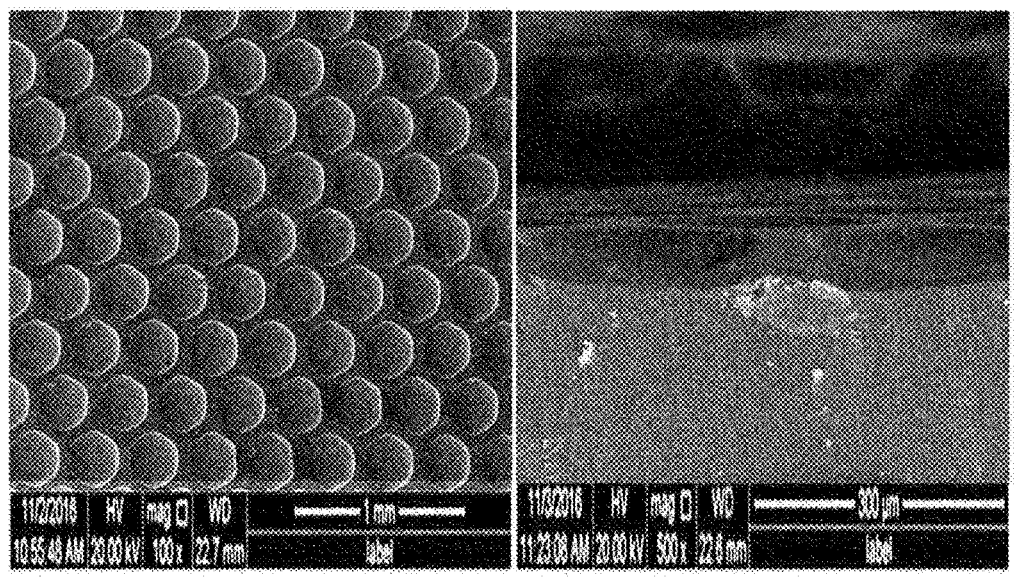
FIG. 14A shows images of an upper surface and a cross section of a metal layer formed according to Comparative Example 1-2.
Figure 14B:
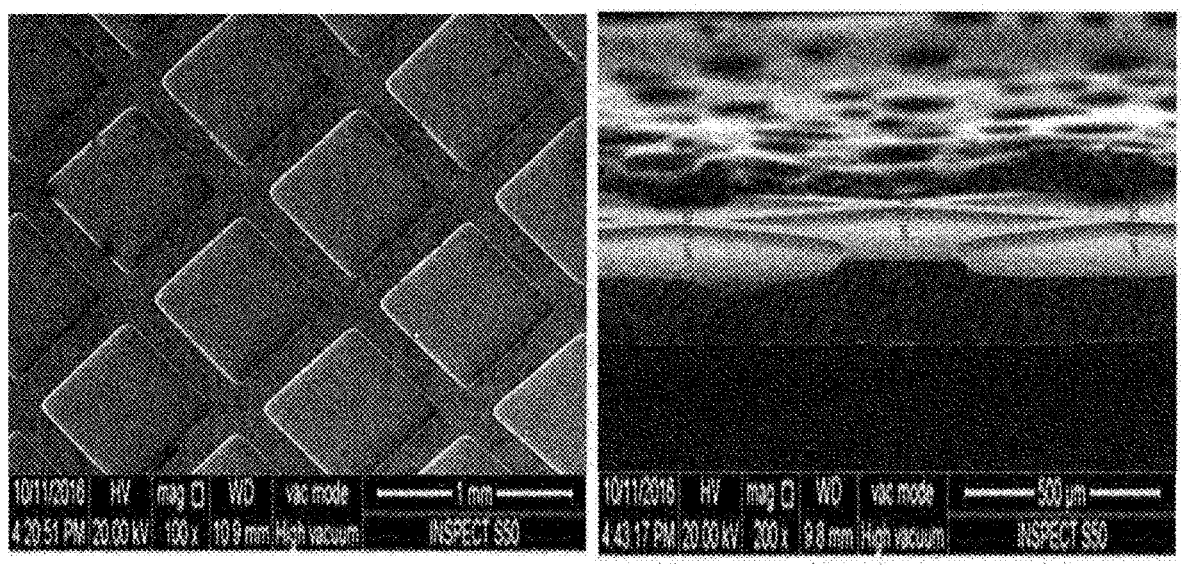
FIG. 14B shows images of an upper surface and a cross section of a metal layer formed according to Comparative Example 1-3.
Figure 14C:
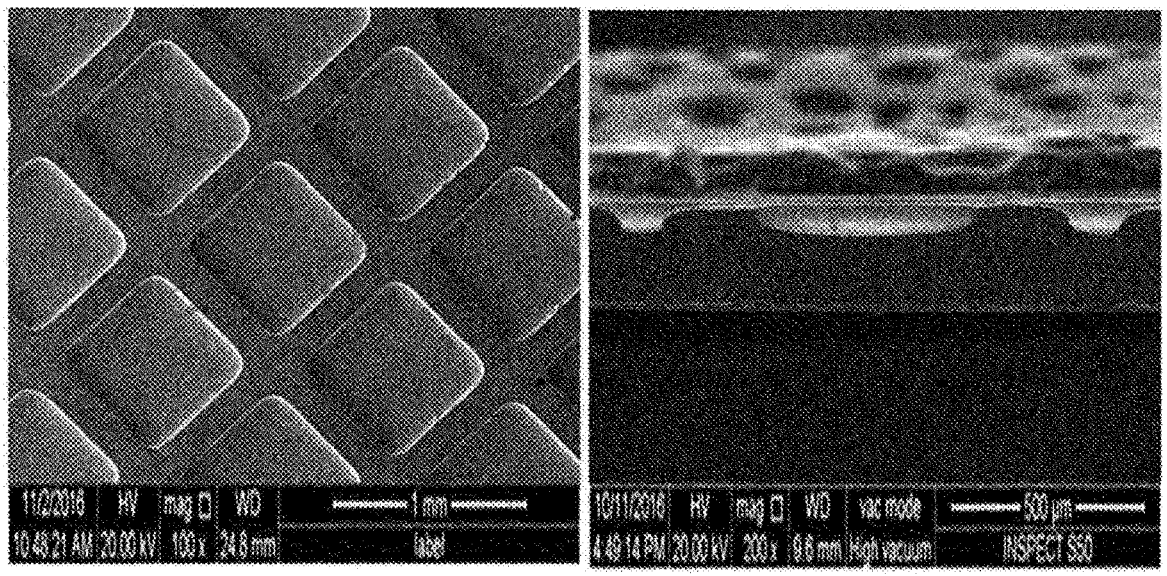
FIG. 14C shows images of an upper surface and a cross section of a metal layer formed according to Comparative Example 1-4.
Figure 14D:
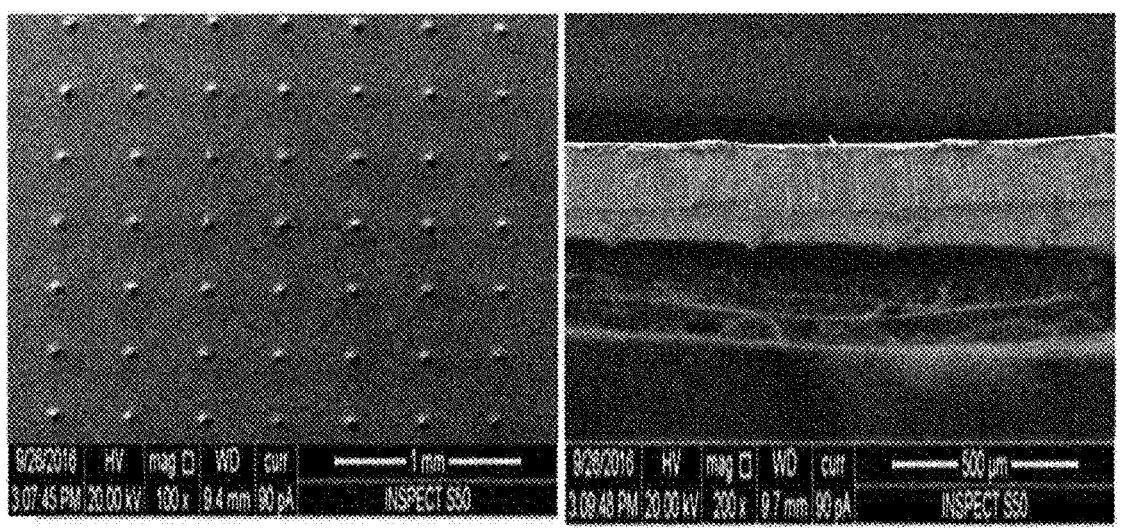
FIG. 14D shows images of an upper surface and a cross section of a metal layer formed according to Comparative Example 1-8.
Figure 15A:
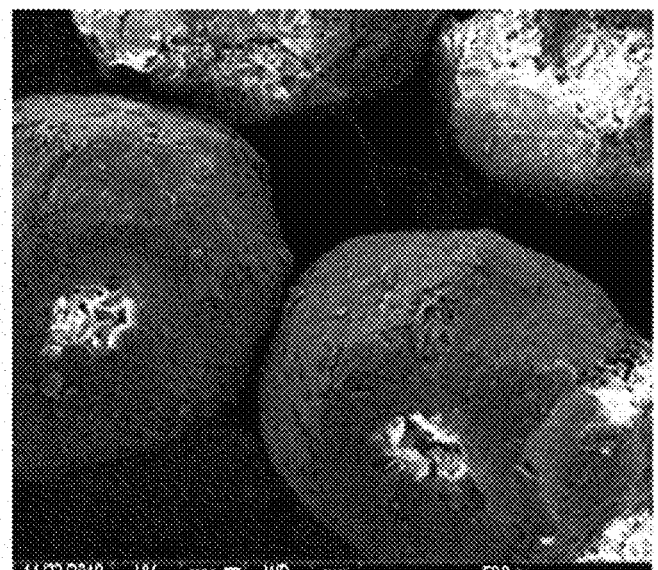
FIG. 15A is a scanning electron microscope (SEM) image of particles used in Examples.
Figure 15B:
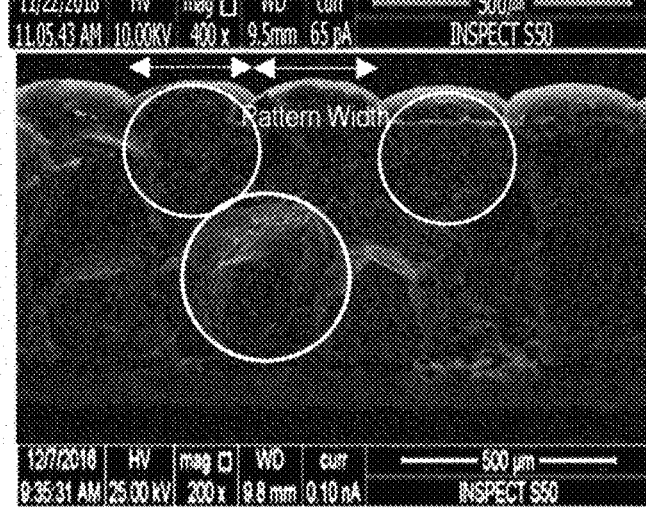
FIG. 15B is an SEM image of a circuit board manufactured according to Example 1-1.
Figure 15C:
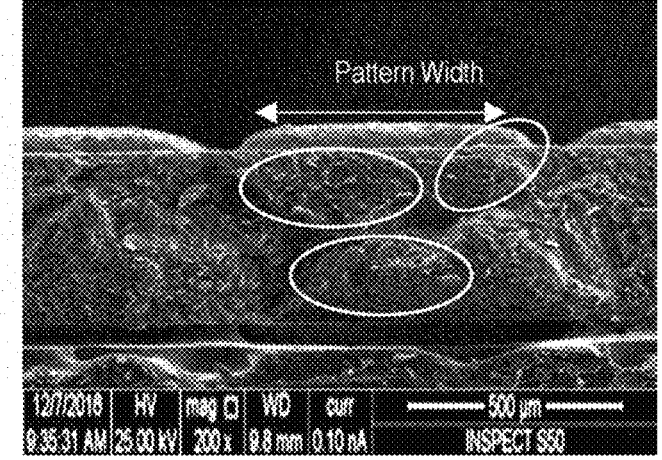
FIG. 15C is an SEM image of a circuit board manufactured according to Example 1-2.

Table 1 shows a width W, a depth D, thermal conductivity, and a heat conductivity deviation of the recesses of Examples 1-1 to 1-3, and Table 2 shows a width W, a depth D, thermal conductivity, and a heat conductivity deviation of the recesses of Comparative Examples 1-1 to 1-8. FIG. 13A shows images of an upper surface and a cross section of a metal layer formed according to Example 1-1, FIG. 13B shows images of an upper surface and a cross section of a metal layer formed according to Example 1-2, and FIG. 13C shows images of an upper surface and a cross section of a metal layer formed according to Example 1-3. FIG. 14A shows images of an upper surface and a cross section of a metal layer formed according to Comparative Example 1-2, FIG. 14B shows images of an upper surface and a cross section of a metal layer formed according to Comparative Example 1-3, FIG. 14C shows images of an upper surface and a cross section of a metal layer formed according to Comparative Example 1-4, and FIG. 14D shows images of an upper surface and a cross section of a metal layer formed according to Comparative Example 1-8. FIG. 15A is a scanning electron microscope (SEM) image of particles used in Examples, FIG. 15B is an SEM image of a circuit board manufactured according to Example 1-1, and FIG. 15C is an SEM image of a circuit board manufactured according to Example 1-2.

TABLE 1

| Experiment number | Shape | Dimension | | | D/W | Heat conductivity (W/mK) | Heat conductivity deviation |
|---|---|---|---|---|---|---|---|
| | | Depth (D: μm) | Width (W: μm) | Pitch (P: μm) | | | |
| Example 1-1 | Hexagonal shape | 70 | 310 | 35 | 0.23 | 52.7 | 1.0 |
| Example 1-2 | Hexagonal shape | 130 | 520 | 5 | 0.25 | 53.1 | 2.8 |
| Example 1-3 | Circular shape | 70 | 310 | 35 | 0.23 | 48.7 | 2.5 |

TABLE 2

| Experiment number | Shape | Dimension | | | D/W | Heat conductivity (W/mK) | Heat conductivity deviation |
|---|---|---|---|---|---|---|---|
| | | Depth (D: μm) | Width (W: μm) | Pitch (P: μm) | | | |
| Comparative Example 1-1 | — | — | — | — | — | 35.8 | 3.1 |
| Comparative Example 1-2 | Hexagonal shape | 30 | 207 | 55 | 0.15 | 39.6 | 1.1 |
| Comparative Example 1-3 | Rhombic shape | 30 | 650 | 160 | 0.05 | 47.6 | 3.4 |
| Comparative Example 1-4 | Rhombic shape | 60 | 700 | 170 | 0.09 | 45.6 | 3.7 |
| Comparative Example 1-5 | Circular shape | 20 | 85 | 50 | 0.23 | 24.8 | 2.5 |
| Comparative Example 1-6 | Circular shape | 60 | 180 | 16 | 0.33 | 37.3 | 2.6 |
| Comparative Example 1-7 | Circular shape | 50 | 120 | 34 | 0.41 | 34.8 | 2.2 |
| Comparative Example 1-8 | Dot shape | 33.5 | — | 310 | — | 36.3 | 4.1 |

Referring to Tables 1 and 2, it can be seen that Examples 1-1 to 1-3 satisfying conditions in which a recess is formed in a metal layer, a width of the recess is 1 to 1.8 times a D50 of a particle, and a ratio of a depth to a width of the recess ranges from 0.2 to 0.3 have high heat conductivity as compared with Comparative Example 1-1 in which a recess is not formed and Comparative Examples 1-2 to 1-8 in which a recess is formed but which do not satisfy conditions in which a width of the recess is 1 to 1.8 times a D50 of a particle and a ratio of a depth to a width of the recess ranges from 0.2 to 0.3.

In addition, referring to Tables 1 and 2 and FIGS. 15A-15C, a surface of the particle does not have a perfect round shape but has an angular shape. Accordingly, Examples 1-1 and 1-2, which have a hexagonal shape that is similar to a shape of the particles, may have higher heat conductivity as compared with Example 1-3 having a circular shape.

In addition, referring to Table 1 and FIGS. 15A-15C, as a width of a recess is greater than a D50 of a particle, one or more particles may be disposed in one recess, and thus, boron nitride agglomerates may be accommodated to be recessed. Accordingly, in Example 1-2, heat conductivity is slightly higher than that in Example 1-1, but a thermal conductivity thereof tends to be increased. Such a phenomenon can also be seen from Table 2. As shown in Comparative Examples 1-3 and 1-4 of Table 2, when a width W of a recess is greater than twice a D50 of a particle, it can be seen that heat conductivity is 40 W/mK or more, but a thermal conductivity is three or more. When a heat conductivity deviation is three or more, reliability of a product may be lowered.

Examples 2-1 to 2-3

An insulating layer in a particle state was stacked on a 0.3 mm thick first copper layer in which a plurality of recesses are formed, a 0.3 mm thick second copper layer in which a plurality of recesses are formed was stacked on the insulating layer, and then, heating and pressing were performed thereon. In this case, the insulating layer in a particle state, in which a D50 is 300 μm, was stacked at a thickness of 500 μm. As in Example 1-1, each recess was formed to have a hexagonal shape as in a structure shown in FIGS. 8, 9C, and 10C and was formed to have a width of 310 μm and a depth of 70 μm.

In Example 2-1, the insulating layer included an epoxy resin, which includes a bisphenol A epoxy compound and diaminodiphenyl sulfone in an equivalence ratio of 1:0.8, in an amount of 25 vol %, and a boron nitride agglomerate in an amount of 75 vol %. In Example 2-2, the insulating layer included an epoxy resin, which includes a bisphenol A epoxy compound and diaminodiphenyl sulfone in an equivalence ratio of 1:0.8, in an amount of 35 vol %, and a boron nitride agglomerate in an amount of 65 vol %. In Example 2-3, the insulating layer included an epoxy resin, which includes a bisphenol A epoxy compound and diaminodiphenyl sulfone in an equivalence ratio of 1:0.8, in an amount of 15 vol %, and a boron nitride agglomerate in an amount of 85 vol %.

Comparative Examples 2-1 and 2-2

An insulating layer in a particle state was stacked on a 0.3 mm thick first copper layer in which a plurality of recesses are formed, a 0.3 mm thick second copper layer in which a plurality of recesses are formed was stacked on the insulating layer, and then, heating and pressing were performed thereon. In this case, the insulating layer in a particle state, in which a D50 is 300 μm, was stacked at a thickness of 500 μm. As in Example 1-1, each recess was formed to have a hexagonal shape as in a structure shown in FIGS. 8, 9C, and 10C and was formed to have a width of 310 μm and a depth of 70 μm.

In Comparative Example 2-1, the insulating layer included an epoxy resin, which includes a bisphenol A epoxy compound and diaminodiphenyl sulfone in an equivalence ratio of 1:0.8, in an amount of 45 vol %, and a boron nitride agglomerate in an amount of 55 vol %. In Comparative Example 2-2, the insulating layer included an epoxy resin, which includes a bisphenol A epoxy compound and diaminodiphenyl sulfone in an equivalence ratio of 1:0.8, in an amount of 5 vol %, and a boron nitride agglomerate in an amount of 95 vol %.

Comparative Examples 2-3 to 2-7

An insulating layer in a particle state was stacked on a 0.3 mm thick first copper layer in which a recess is not formed, a 0.3 mm thick second copper layer in which a recess is not formed was stacked on the insulating layer, and then, heating and pressing were performed thereon. In this case, the insulating layer in a particle state, in which a D50 is 300 μm, was stacked at a thickness of 500 μm.

The insulating layer included an epoxy resin including a bisphenol A epoxy compound and diaminodiphenyl sulfone in an equivalence ratio of 1:0.8 and a boron nitride agglomerate. In Comparative Example 2-3, the insulating layer included a resin in an amount of 45 vol % and a boron nitride agglomerate in an amount of 55 vol %. In Comparative Example 2-4, the insulating layer included a resin in an amount of 35 vol % and a boron nitride agglomerate in an amount of 65 vol %. In Comparative Example 2-5, the insulating layer included a resin in an amount of 25 vol % and a boron nitride agglomerate in an amount of 75 vol %. In Comparative Example 2-6, the insulating layer included a resin in an amount of 15 vol % and a boron nitride agglomerate in an amount of 85 vol %. In Comparative Example 2-7, the insulating layer included a resin in an amount of 5 vol % and a boron nitride agglomerate in an amount of 95 vol %.

Table 3 shows results of measuring heat conductivity and bond strength of substrates manufactured according to Examples 2-1 to 2-3, and Table 4 shows results of measuring heat conductivity and bond strength of substrates manufactured according to Comparative Examples 2-1 to 2-7.

TABLE 3

| Experiment number | Heat conductivity (W/mK) | Bond strength (N) |
| --- | --- | --- |
| Example 2-1 | 52.7 | 49.3 |
| Example 2-2 | 43.9 | 55.4 |
| Example 2-3 | 55.4 | 37.4 |

TABLE 4

| Experiment number | Heat conductivity (W/mK) | Bond strength (N) |
| --- | --- | --- |
| Comparative Example 2-1 | 32.1 | 82.6 |
| Comparative Example 2-2 | 78.6 | 12.1 |
| Comparative Example 2-3 | 17.3 | 47.4 |
| Comparative Example 2-4 | 29.9 | 31.9 |

TABLE 4-continued

| Experiment number | Heat conductivity (W/mK) | Bond strength (N) |
| --- | --- | --- |
| Comparative Example 2-5 | 35.8 | 26.5 |
| Comparative Example 2-6 | 40.3 | 19.1 |
| Comparative Example 2-7 | 43.2 | Unmeasurable |

Referring to Tables 3 and 4, it can be seen that when a metal layer, in which a recess is formed, is used, heat conductivity and bond strength are high throughout all composition ratios as compared with when a metal layer, in which a recess is not formed, is used.

In addition, referring to Examples 2-1 to 2-3 and Comparative Examples 2-1 and 2-2, when a resin is included in an amount ranging from 15 vol % to 35 vol % and a boron nitride agglomerate is included in an amount ranging from 65 vol % to 85 vol %, it is possible to concurrently satisfy a condition in which heat conductivity is 40 W/mk or more and a condition in which bond strength is 35 N or more. In particular, as in Example 2-1, when a resin is included in an amount ranging from 20 vol % to 30 vol % and a boron nitride agglomerate is included in an amount ranging from 70 vol % to 80 vol %, it is possible to concurrently satisfy a condition in which heat conductivity is 50 W/mK or more and a condition in which bond strength is 40 N or more.

Examples 3-1 to 3-3

An insulating layer in a particle state was stacked on a 0.3 mm thick first copper layer in which a plurality of recesses are formed, a 0.3 mm thick second copper layer in which a plurality of recesses are formed was stacked on the insulating layer, and then, heating and pressing were performed thereon. In this case, the insulating layer in a particle state, in which a D50 is 300 μm, included an epoxy resin, which includes a bisphenol A epoxy compound and diaminodiphenyl sulfone in an equivalence ratio of 1:0.8, in an amount of 25 vol %, and a boron nitride agglomerate in an amount of 75 vol %. As in Example 1-1, each recess was formed to have a hexagonal shape as in a structure shown in FIGS. 8, 9C, and 10C and was formed to have a width of 310 μm and a depth of 70 μm.

In Example 3-1, an insulating layer was formed to have a thickness of 310 in Example 3-2, an insulating layer was formed to have a thickness of 500 and in Example 3-3, an insulating layer was formed to have a thickness of 600 μm.

Comparative Examples 3-1 and 3-2

An insulating layer in a particle state was stacked on a 0.3 mm thick first copper layer in which a plurality of recesses are formed, a 0.3 mm thick second copper layer in which a plurality of recesses are formed was stacked on the insulating layer, and then, heating and pressing were performed thereon. In this case, the insulating layer in a particle state, in which a D50 is 300 μm, included an epoxy resin, which includes a bisphenol A epoxy compound and diaminodiphenyl sulfone in an equivalence ratio of 1:0.8, in an amount of 25 vol %, and a boron nitride agglomerate in an amount of 75 vol %. As in Example 1-1, each recess was formed to have a hexagonal shape as in a structure shown in FIGS. 8, 9C, and 10C and was formed to have a width of 310 μm and a depth of 70 μm.

In Comparative Example 3-1, an insulating layer was formed to have a thickness of 280 μm, and in Comparative Example 3-2, an insulating layer was formed to have a thickness of 800 μm.

Comparative Examples 3-3 to 3-7

An insulating layer in a particle state was stacked on a 0.3 mm thick first copper layer in which a recess is not formed, a 0.3 mm thick second copper layer in which a recess is not formed was stacked on the insulating layer, and then, heating and pressing were performed thereon. In this case, the insulating layer in a particle state, in which a D50 is 300 μm, included an epoxy resin, which includes a bisphenol A epoxy compound and diaminodiphenyl sulfone in an equivalence ratio of 1:0.8, in an amount of 25 vol %, and a boron nitride agglomerate in an amount of 75 vol %.

In Comparative Example 3-3, an insulating layer was formed to have a thickness of 280 In Comparative Example 3-4, an insulating layer was formed to have a thickness of 350 μm. In Comparative Example 3-5, an insulating layer was formed to have a thickness of 500 μm. In Comparative Example 3-6, an insulating layer was formed to have a thickness of 600 μm. In Comparative Example 3-7, an insulating layer was formed to have a thickness of 800 μm.

Table 5 shows results of measuring heat conductivity of substrates manufactured according to Examples 3-1 to 3-3, and Table 6 shows results of measuring heat conductivity of substrates manufactured according to Comparative Examples 3-1 to 3-7

TABLE 5

| Experiment number | Heat conductivity (W/mK) |
|---|---|
| Example 3-1 | 54.6 |
| Example 3-2 | 52.7 |
| Example 3-3 | 50.3 |

TABLE 6

| Experiment number | Heat conductivity (W/mK) |
|---|---|
| Comparative Example 3-1 | 35.2 |
| Comparative Example 3-2 | 45.4 |
| Comparative Example 3-3 | 18.7 |
| Comparative Example 3-4 | 41.2 |
| Comparative Example 3-5 | 35.8 |
| Comparative Example 3-6 | 30.6 |
| Comparative Example 3-7 | 22.9 |

Referring to Tables 5 and 6, it can be seen that when a metal layer, in which a recess is formed, is used, heat conductivity is high throughout all thicknesses as compared with when a metal layer, in which a recess is not formed, is used.

In addition, referring to Examples 3-1 to 3-3 and Comparative Examples 3-1 and 3-2, it can be seen that when a thickness of an insulating layer is 1 to 2 times a D50 of a particle, a thermal conductivity is 50 W/mK or more.

Although the present invention has been described with reference to the exemplary embodiments of the present invention, those of ordinary skill in the art should understand that the present invention may be modified and changed in various ways within a scope that does not depart from the spirit and area of the present invention described in the claims below.

DESCRIPTIONS OF REFERENCE NUMERALS

100: substrate
110: first metal layer
120: insulating layer
130: second metal layer
112, 132: recess

The invention claimed is:

1. A circuit board comprising:
a first metal layer;
an insulating layer disposed on the first metal layer and including particles in which a boron nitride agglomerate is coated with a resin; and
a second metal layer disposed on the insulating layer,
wherein at least a portion of one surface of both surfaces of the first metal layer, on which the insulating layer is disposed, is in contact with one surface of the insulating layer,
at least a portion of one surface of both surfaces of the second metal layer, on which the insulating layer is disposed, is in contact with the other surface of the insulating layer,
a plurality of grooves are formed in the one surfaces of the both surfaces of at least one of the first metal layer and the second metal layer, on which the insulating layer is disposed,
at least a portion of each of the particles is disposed in at least a portion of each of the plurality of grooves,
a width (W) of at least one of the plurality of grooves is 1 to 1.8 times a D50 of the particles, and
a ratio (D/W) of a depth (D) to the width (W) of the at least one of the plurality of grooves ranges from 0.2 to 0.3.

2. The circuit board of claim 1, wherein the at least one of the plurality of grooves includes a wall surface disposed in a direction of the depth (D) and a bottom surface connected to the wall surface.

3. The circuit board of claim 2, wherein the bottom surface has a concave shape.

4. The circuit board of claim 3, wherein the bottom surface is formed such that the depth (D) is gradually increased in a direction from an edge to a center of the width.

5. The circuit board of claim 3, wherein a cross section of the bottom surface has a curved shape.

6. The circuit board of claim 3, wherein the wall surface is provided as a plurality of wall surfaces, and
a first wall surface of the plurality of wall surfaces forms a certain angle with respect to a second wall surface adjacent to the first wall surface.

7. The circuit board of claim 6, wherein the wall surface is provided as six wall surfaces.

8. The circuit board of claim 1, wherein the one surfaces of the both surfaces of the first metal layer and the both surfaces of the second metal surface, in which the plurality of grooves are formed, have a honeycomb shape.

9. The circuit board of claim 1, wherein at least one of the first metal layer and the second metal layer includes copper (Cu) and has a circuit pattern.

10. The circuit board of claim 1, wherein the insulating layer is in direct contact with at least one of the first metal layer and the second metal layer.

11. The circuit board of claim 1, wherein a thickness of the insulating layer is 1 to 2 times the D50 of the particles.

12. The circuit board of claim 1, wherein the boron nitride agglomerate includes:
an agglomerate in which a plurality of plate-shaped boron nitride compounds agglomerate together; and a coating layer formed on the agglomerate,
wherein the coating layer includes a polymer having a monomer below:

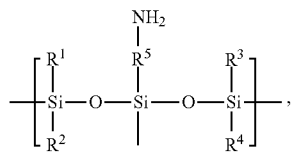

wherein one of $R^1$, $R^2$, $R^3$, and $R^4$ is hydrogen (H),
the remainder thereof are each selected from the group consisting of $C_1$-$C_3$ alkyl, $C_2$-$C_3$ alkene, and $C_2$-$C_3$ alkyne, and
$R^5$ is a linear, branched, or cyclic divalent organic linker having one to twelve carbon atoms.

13. The circuit board of claim 12, wherein the insulating layer includes the resin in an amount ranging from 15 vol % to 35 vol % and the boron nitride agglomerate in an amount ranging from 65 vol % to 85 vol %.

14. The circuit board of claim 1, wherein the plurality of grooves are formed in a regular pattern at a certain interval.

15. The circuit board of claim 1, wherein a density of the plurality of grooves formed on the first metal layer differs from a density of the plurality of grooves formed on the second metal layer.

16. The circuit board of claim 1, wherein a pattern of the plurality of grooves formed on the first metal layer differs from a pattern of the plurality of grooves formed on the second metal layer.

17. The circuit board of claim 1, wherein the width (W) of at least one of the plurality of grooves is 1 to 1.4 times a D50 of the particles.

18. The circuit board of claim 1, wherein the width (W) of at least one of the plurality of grooves is greater than 300 µm.

19. A circuit board comprising:
a first metal layer;
an insulating layer disposed on the first metal layer; and
a second metal layer disposed on the insulating layer,
wherein at least a portion of one surface of both surfaces of the first metal layer, on which the insulating layer is disposed, is in contact with one surface of the insulating layer,
wherein at least a portion of one surface of both surfaces of the second metal layer, on which the insulating layer is disposed, is in contact with the other surface of the insulating layer,
wherein a plurality of protrusions are formed on at least one of both surfaces of the insulating layer,
wherein a plurality of recesses are formed in the one surfaces of the both surfaces of the first metal layer and the both surfaces of the second metal layer, which are in contact with the plurality of protrusions,
wherein at least a portion of each of the protrusions is disposed in at least a portion of each of the plurality of recesses,
wherein a ratio (D/W) of a depth (D) to a width (W) of at least one of the plurality of recesses ranges from 0.2 to 0.3,
wherein the insulating layer includes particles of inorganic filler coated with a resin, and
wherein the width (W) of at least one of the plurality of recesses is 1 to 1.8 times a D50 of the particles.

20. The circuit board of claim 19, wherein
at least some of the plurality of protrusions are the particles.

* * * * *